(12) United States Patent
Katou (10) Patent No.: US 7,023,172 B2
(45) Date of Patent: Apr. 4, 2006

(54) MOTOR CONTROLLER (75) Inventor: Masanori Katou, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/501,477

(22) PCT Filed: Mar. 12, 2003

(86) PCT No.: PCT/JP03/02920

§ 371 (c)(1),
(2), (4) Date: Jul. 14, 2004

(87) PCT Pub. No.: WO2004/082114

PCT Pub. Date: Sep. 23, 2004

(65) Prior Publication Data

US 2005/0071090 A1 Mar. 31, 2005

(51) Int. Cl.
H02P 27/00 (2006.01)
H02P 27/04 (2006.01)
H02P 27/06 (2006.01)

(52) U.S. Cl. .................. 318/807; 318/808; 318/809; 318/810; 318/811; 340/590; 702/33; 702/34

(58) Field of Classification Search ............. 318/807, 318/808, 809, 810, 811; 702/33, 34; 340/590
See application file for complete search history.

(56) References Cited

U.S. PATENT DOCUMENTS

| | | | | |
|---|---|---|---|---|
| 4,970,497 A | * | 11/1990 | Broadwater et al. | 340/598 |
| 5,638,246 A | * | 6/1997 | Sakamoto et al. | 361/103 |
| 5,721,455 A | * | 2/1998 | Takashita | 257/713 |
| 5,912,794 A | * | 6/1999 | Ichikawa | 361/92 |
| 5,977,785 A | * | 11/1999 | Burward-Hoy | 324/760 |
| 6,246,503 B1 | * | 6/2001 | Asada et al. | 359/196 |
| 6,288,371 B1 | * | 9/2001 | Hamilton et al. | 219/530 |
| 6,724,313 B1 | * | 4/2004 | Sato et al. | 340/590 |
| 6,759,964 B1 | * | 7/2004 | Sato et al. | 340/590 |

FOREIGN PATENT DOCUMENTS

| | | |
|---|---|---|
| JP | 8-51768 A | 2/1996 |
| JP | 8-126337 A | 5/1996 |
| JP | 10-337084 A | 12/1998 |
| JP | 2003-009541 A | 1/2003 |
| JP | 2003-018861 A | 1/2003 |

* cited by examiner

Primary Examiner—David Martin
Assistant Examiner—Elias Hiruy
(74) Attorney, Agent, or Firm—Sughrue Mion, PLLC (57) ABSTRACT An electric motor control apparatus of this invention estimates changes in temperature of a semiconductor device to compute temperature change amplitude 108 based on an output current signal 105 computed from a current flowing through the semiconductor device of a switching circuit 5, an operating frequency signal and a carrier frequency signal by a temperature change estimation part 11, and makes conversion into the number of power cycles 110 corresponding to the temperature change amplitude 108 from power cycle curve data stored in a power cycle curve data storage part 14 and computes a thermal stress signal 111 by a thermal stress computation part 13, and does life estimation of the semiconductor device based on the thermal stress signal 111 and produces an output to a display part 16 as a life estimation result signal 112 by a life estimation part 15a.

3 Claims, 6 Drawing Sheets

MOTOR CONTROLLER

TECHNICAL FIELD

This invention relates to an electric motor control apparatus for performing variable speed control of an electric motor.

BACKGROUND ART

In an electric motor control apparatus such as an inverter apparatus using a semiconductor device for electric power, at the time of an operation of the apparatus, the semiconductor device for electric power generates heat and a junction temperature of a chip increases and at the time of a stop of the apparatus, the heat generation stops and the junction temperature decreases. Also, at the time of starting and stopping an operation of an electric motor and the time of a sudden change in a load, an output current of the apparatus changes largely, so that the junction temperature of the semiconductor device for electric power also changes largely. As a result of this, thermal expansion and thermal shrinkage of a chip portion of the semiconductor device for electric power are repeated due to repeats of the operations and stops and repeats of the sudden changes in the load or speed.

On the other hand, the semiconductor device for electric power is generally assembled using various materials with different thermal expansion coefficients. Particularly when a temperature of a junction between a heat spreader and a wire bonding portion or the semiconductor device for electric power increases, wire bonding gradually begins to peel off a chip due to thermal expansion stress of a coating agent of the chip or metal fatigue of a junction material begins to occur due to thermal expansion stress by a difference between the chip and the heat spreader in thermal expansion coefficients. Due to repeated operations and stops and repeats of the sudden changes in the load or speed, finally, the wire bonding peels completely and becomes an open state. That is, it results in failure or breakage of the semiconductor device for electric power. A cycle of thermal expansion and thermal shrinkage to the time when this wire bonding peels completely due to thermal expansion stress and results in failure or breakage is called a power cycle.

Therefore, particularly in an apparatus with high repeating frequency of the operations and stops, for example, in the case of using the inverter apparatus in motor driving of an elevator or an AC servo apparatus, or in an apparatus with sudden changes in the load, for example, in the case of using the inverter apparatus in a compressor, a life of the semiconductor device for electric power shortens due to the power cycle, so that some measures need to be taken.

There is a life monitoring apparatus of a semiconductor device for electric power disclosed in Patent Reference 1 (JP-A-8-51768) as means in which an object is to provide an apparatus capable of monitoring a life of a semiconductor device for electric power due to a power cycle and grasping time of maintenance of the semiconductor device for electric power before the life expires and preventing breakage of the semiconductor device for electric power.

The object of Patent Reference 1 is to protect the semiconductor device for electric power used in an inverter apparatus etc. before resulting in the life due to the power cycle. It is constructed so that from a correlation between a power cycle and a difference between junction temperatures of the semiconductor device for electric power, a power cycle corresponding to the difference between junction temperatures of the semiconductor device for electric power in the inverter apparatus is estimated to be the life and the number of operations of the inverter apparatus is counted by a counter. When a count value exceeds a first reference value, an alarm signal is outputted and when the count value exceeds a second reference value, a trip signal is outputted and the inverter apparatus is stopped forcedly.

In Patent Reference 1, there was a problem that a value of the difference between junction temperatures changes normally but the value of the difference between junction temperatures is set to a fixed value by selecting typical one point in operations and stops of the apparatus and desired accuracy of an estimated life cannot be obtained.

Also, there is Patent Reference 2 (JP-A-8-126337) as means in which an object is to obtain an inverter apparatus capable of taking life-prolonging measures, for example, improving a use method before reaching a life of a semiconductor device for electric power.

According to this reference, alarm processing such as an alarm display command can be performed when the number of thermal stresses obtained from the number of thermal stresses of temperature change amplitude computed based on amplitude in changes in an estimated temperature of the semiconductor device for electric power and the number of thermal stresses of temperature change ratio computed based on ratio in changes in an estimated temperature of the semiconductor device for electric power exceeds the number of allowable thermal stresses. Also, one can obtain the residual life time from the number of thermal stresses and the number of allowable thermal stresses to execute a display command. Alarm processing such as an alarm display command performed when operation cannot be performed by expected life time with operation of set time when the number of thermal stresses every set time obtained from the number of thermal stresses of temperature change amplitude every set time and the number of thermal stresses of temperature change ratio every set time exceeds the number of allowable thermal stresses per set time and also, obtaining an operable life with operation of set time to execute a display command are also described in Patent Reference 2.

In Patent Reference 2, a part which has reached fatigue is displayed by life estimation due to thermal stress and a worker can easily decide the part to prevent a fault and also by estimating whether or not operation can be performed by expected life time with operation of set time, the worker can improve a use method or a load state and use frequency of the inverter apparatus and thereby take life-prolonging measures. Unless the worker inspects a display part and checks its display or alarm and checks a life determination result or a life estimation result, the life-prolonging measures cannot be taken. There was also a problem that an abnormal stop of a system is made since the inverter apparatus stops an output by a life determination without taking the life-prolonging measures in case of missing the display or alarm.

This invention is implemented to solve the problems as described above, and a first object is to obtain an electric motor control apparatus capable of doing life estimation with high accuracy.

Also, a second object is to obtain an electric motor control apparatus capable of satisfying a set expected life by automatically decreasing amplitude of changes in temperature of a semiconductor device.

DISCLOSURE OF THE INVENTION

In an electric motor control apparatus for converting DC electric power into AC electric power of a variable frequency and a variable voltage and performing variable control of an electric motor acting as a load, having a switching circuit having a semiconductor device such as a power transistor and a diode connected in parallel with this power transistor. A control part for generating a driving pulse based on an operating frequency signal set by an operating frequency setting part and a carrier frequency signal set by a carrier frequency setting part, and a driving circuit for amplifying the driving pulse outputted from this control part and performing on-off control of the power transistor of the switching circuit. The electric motor control apparatus of this invention comprises a current computation part for computing an output current from a current flowing through the semiconductor device and also outputting a current breaking signal to the control part when an output current signal computed exceeds a current limit value signal outputted from a current limit level adjusting part, a temperature change estimation part for estimating changes in temperature of the semiconductor device to compute temperature change amplitude based on this output current signal, the operating frequency signal and the carrier frequency signal, a power cycle curve data storage part for storing power cycle curve data showing a relation between the temperature change amplitude and a power cycle life of the semiconductor device, a thermal stress computation part for converting the temperature change amplitude computed by the temperature change estimation part into the number of power cycles used as the power cycle life of the semiconductor device by the power cycle curve data and computing a thermal stress signal, and a life estimation part for doing life estimation of the semiconductor device based on this thermal stress signal and producing an output to a display part as a life estimation result signal and further calculating life time per set time and comparing the life time with an expected life and outputting an alarm to the display part as a life determination signal when the life time is shorter than the expected life, so that life estimation with high accuracy can be done.

Also, since it is constructed so that the life estimation part outputs the life estimation result signal and the life determination signal to the current limit level adjusting part and also the current limit level adjusting part makes an automatic adjustment so as to decrease a current limit value signal outputted to the current computation part when alarm information is included in the life estimation result signal or the life determination signal is inputted, amplitude of changes in temperature of the semiconductor device can be decreased and an expected life set can be satisfied.

Further, since it is constructed so that the life estimation part outputs the life estimation result signal and the life determination signal to the carrier frequency setting part and also the carrier frequency setting part makes an automatic adjustment so as to lower an upper limit value of the carrier frequency and outputs a carrier frequency signal to the control part when alarm information is included in the life estimation result signal or the life determination signal is inputted, amplitude of changes in temperature of the semiconductor device can be decreased and an expected life set can be satisfied.

BEST MODE FOR CARRYING OUT THE INVENTION

First Embodiment

Figure 1:
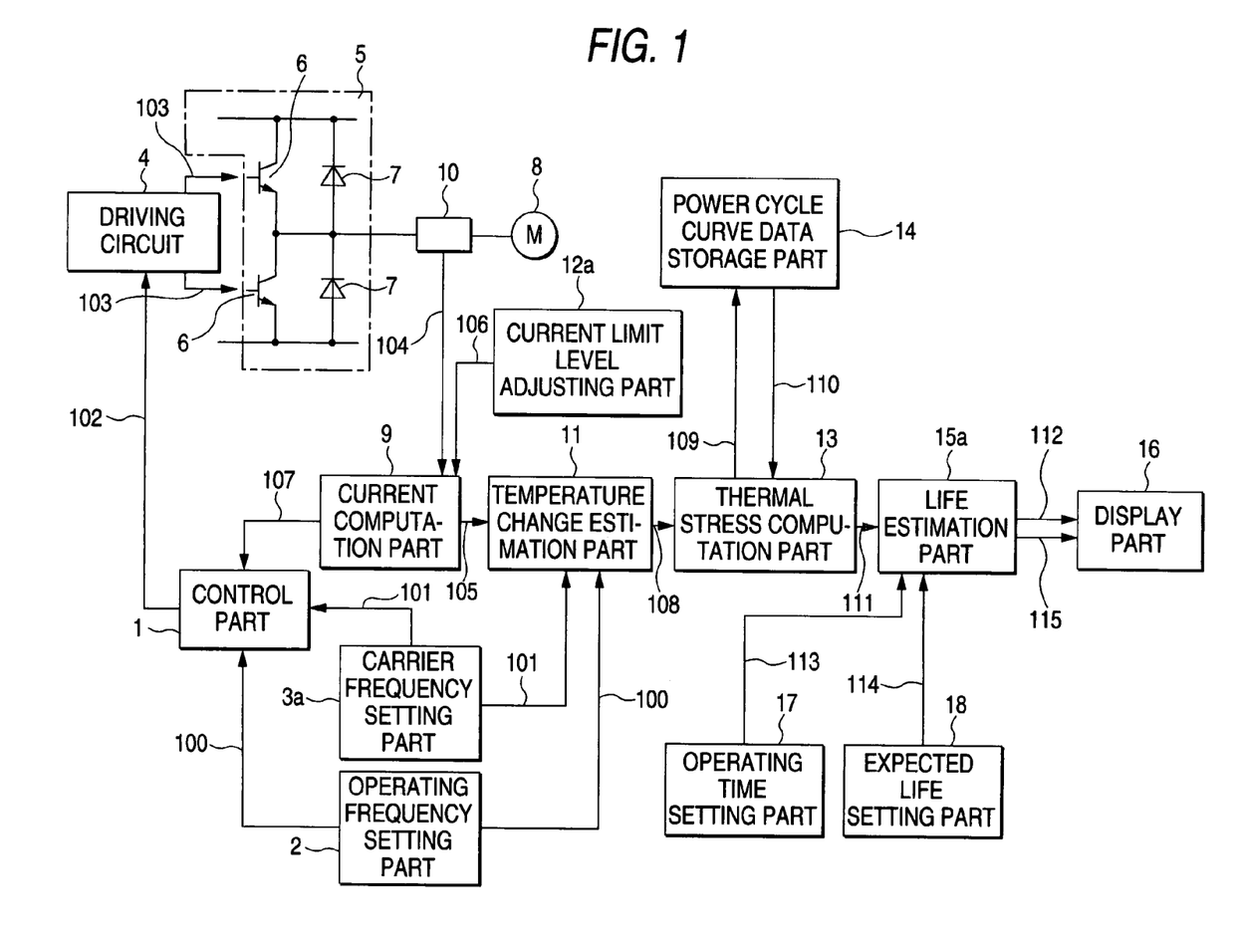
FIG. 1 is a diagram showing a configuration of an electric motor control apparatus according to a first embodiment of this invention.

FIG. 1 is a diagram showing a configuration of an electric motor control apparatus according to a first embodiment of this invention. In the diagram, a control part 1 generates a driving pulse 102 based on an operating frequency signal 100 set by an operating frequency setting part 2 and a carrier frequency signal 101 set by a carrier frequency setting part 3a, and outputs the driving pulse to a driving circuit 4. The driving circuit 4 generates a driving pulse 103 amplified by the driving pulse 102 and performs on-off control of power transistors 6 from which a switching circuit 5 is constructed and thereby, DC electric power is converted into AC electric power of a variable frequency and a variable voltage and variable control of an electric motor 8 acting as a load is performed. Also, numerals 7 are diodes connected in parallel with the power transistors 6.

Also, a current computation part 9 computes an output current from a current detection signal 104 detected by a current detector 10, and outputs an output current signal 105 to a temperature change estimation part 11. Also, the current computation part 9 compares the computed output current signal 105 with a current limit value signal 106 set by a current limit level adjusting part 12a in order to protect the electric motor 8 and semiconductor devices such as the power transistors 6 and the diodes 7 from an overcurrent and when the output current signal 105 exceeds the current limit value signal 106, a current breaking signal 107 is outputted to the control part 1.

Also, based on the operating frequency signal 100 set by the operating frequency setting part 2, the carrier frequency signal 101 set by the carrier frequency setting part 3a and the output current signal 105 computed by the current computation part 9, the temperature change estimation part 11 estimates changes in temperatures of the semiconductor devices such as the power transistors 6 and the diodes 7 and computes temperature change amplitude.

Temperature change estimation processing in the temperature change estimation part 11 will be described.

Figure 2:
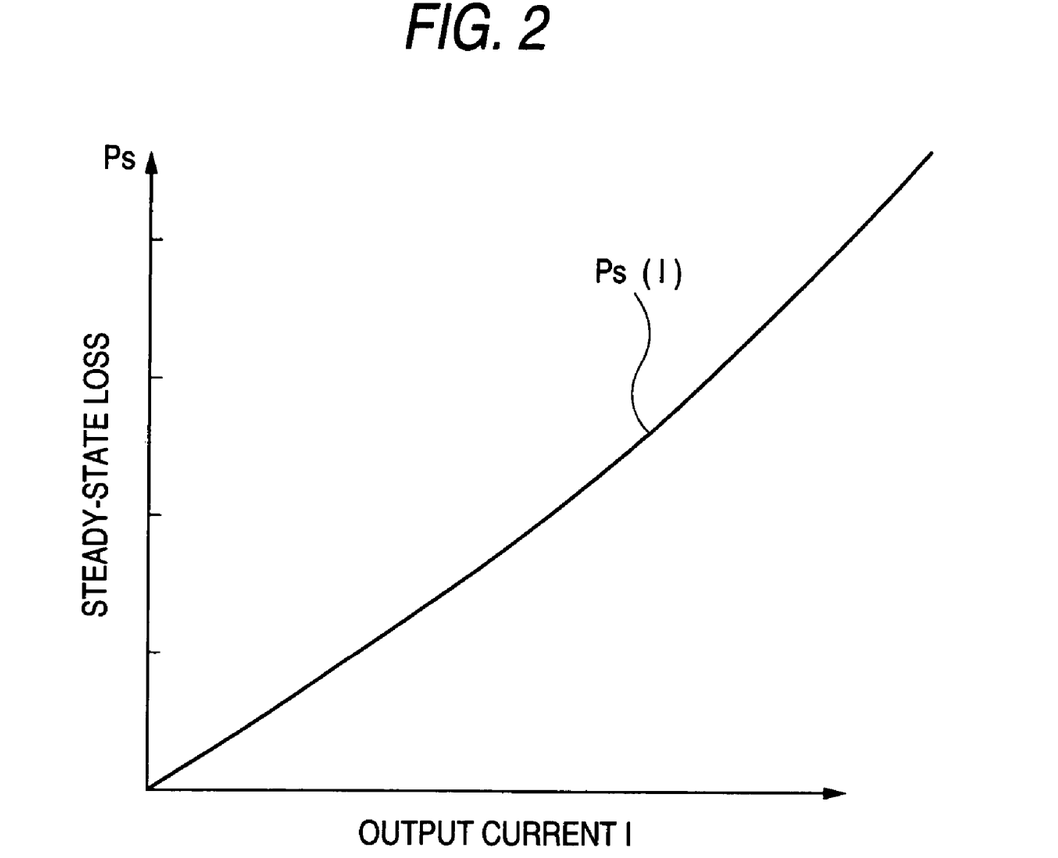
FIG. 2 is a graph showing one example of steady-state loss characteristics of semiconductor devices such as a power transistor and a diode.

One example of steady-state loss characteristics of the semiconductor devices such as the power transistors and the diodes is shown in FIG. 2. In FIG. 2, the axis of abscissa is an output current I (the output current signal 105 computed by the current computation part 9) and the axis of ordinate is a steady-state loss Ps. The steady-state loss Ps has characteristics increasing with increasing the output current I.

Figure 3:
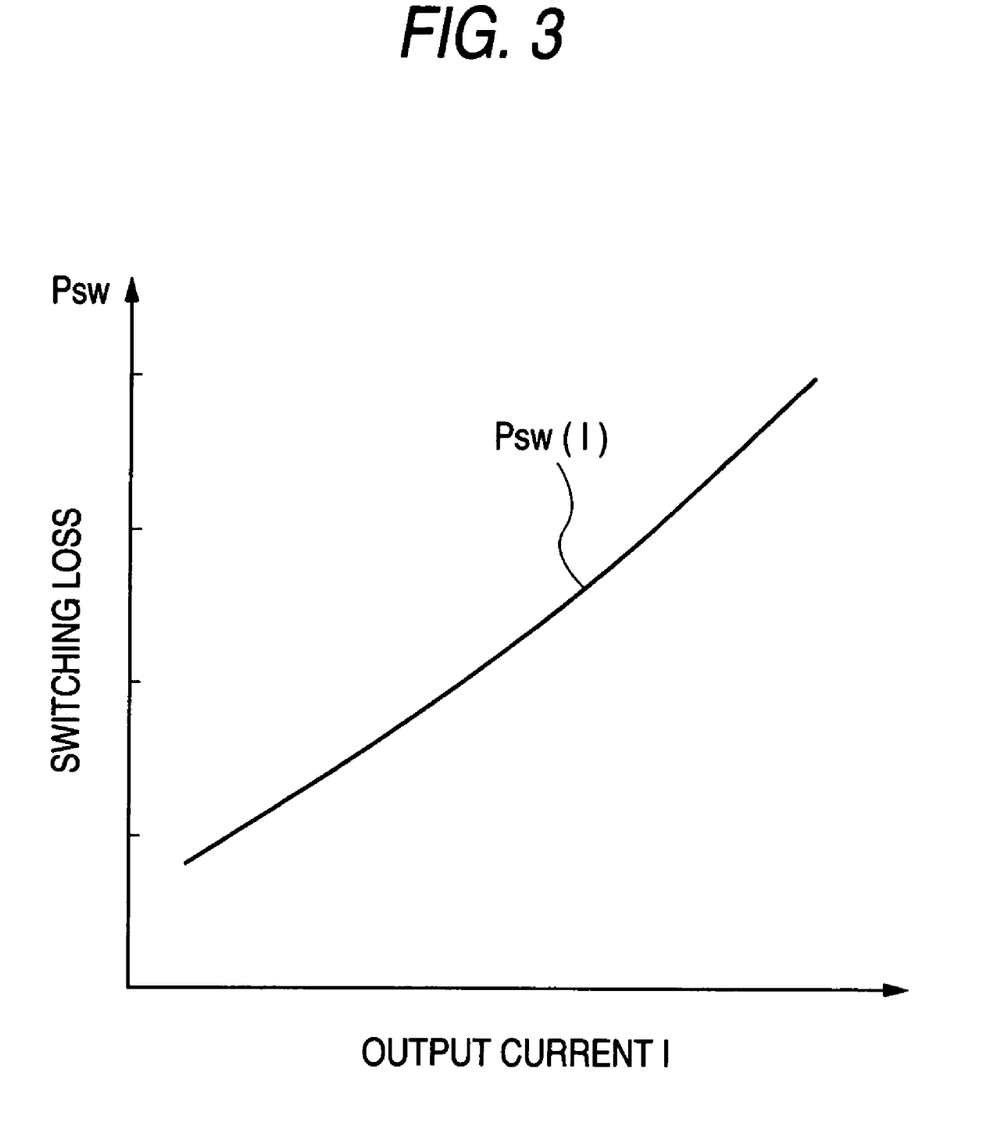
FIG. 3 is a graph showing one example of switching loss characteristics of semiconductor devices such as a power transistor and a diode.

Also, one example of switching loss characteristics of the semiconductor devices such as the power transistors and the diodes is shown in FIG. 3. In FIG. 3, the axis of abscissa is an output current I (the output current signal 105 computed by the current computation part 9) and the axis of ordinate is a switching loss Psw. The switching loss Psw has characteristics increasing with increasing the output current I.

First, using the output current signal 105 (described as the output current I in FIG. 2 and FIG. 3) computed by the current computation part 9, the steady-state loss Ps is obtained by the steady-state loss characteristics shown in FIG. 2 and the switching loss Psw is obtained by the switching loss characteristics shown in FIG. 3. Next, from the steady-state loss Ps and the switching loss Psw, a carrier frequency fc which is the carrier frequency signal 101 set by the carrier frequency setting part 3a, and a computation period $\Delta\tau$, a heating value Q of the semiconductor devices such as the power transistors 6 and the diodes 7 from which the switching circuit 5 is constructed is obtained by Formula (1).

$$Q=Ps(I)+Psw(I)\times fc\times\Delta\tau \quad (1)$$

A temperature change amount $\Delta\theta$ for computation time $\Delta\tau$ can be obtained from the heating value Q of the power transistors 6 and the diodes 7 and transient thermal resistance Rth(t) defined by a mounted state of the power transistors 6 and the diodes 7, and the temperature change amount $\Delta\theta$ is summed and computed to obtain a temperature change and a minimum point and a maximum point of this change are extracted and temperature change amplitude $\Delta T1$ is calculated and is outputted to a thermal stress computation part 13 as a temperature change amplitude signal 108.

Figure 4:
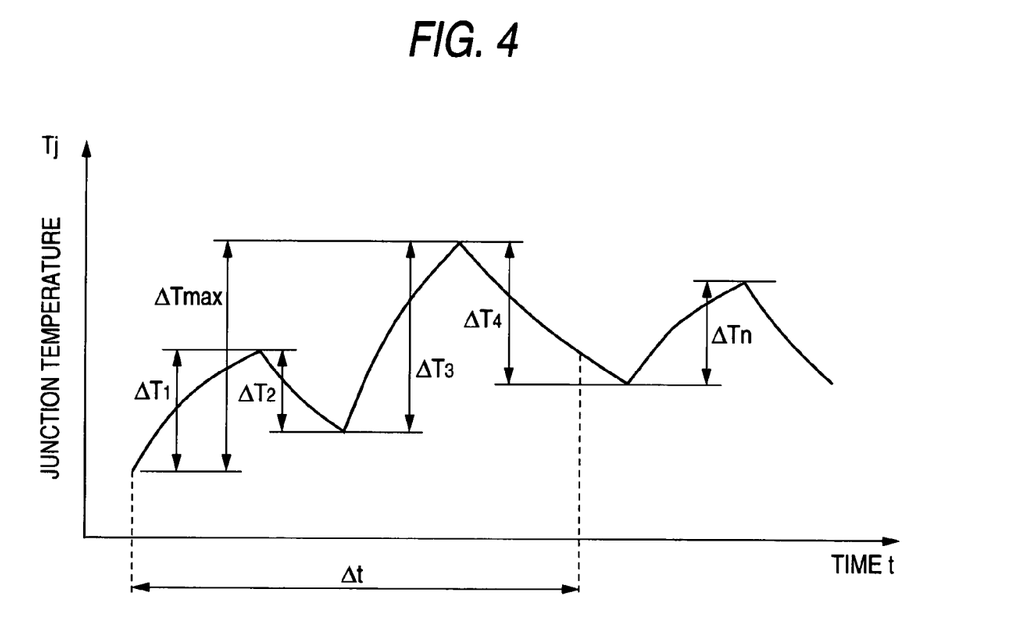
FIG. 4 is a graph showing one example of changes in temperature of a semiconductor device.

One example of changes in temperature of the semiconductor devices is shown in FIG. 4. In FIG. 4, $\Delta t$ is set time, and $\Delta T1$, $\Delta T2$, $\Delta T3$, $\Delta T4$ and $\Delta Tn$ are temperature change amplitudes, and $\Delta Tmax$ is the maximum temperature change amplitude at the set time $\Delta t$. A cycle of thermal expansion and thermal shrinkage to the time of resulting in failure due to a cycle of an increase in temperature of this semiconductor device is called a power cycle.

The thermal stress computation part 13 computes a power cycle life corresponding to a temperature change amplitude signal 109 as a power cycle number signal 110 by power cycle curve data which shows a relation between the temperature change amplitude and a power cycle life of the semiconductor device and is stored in a power cycle curve data storage part 14.

Figure 5:
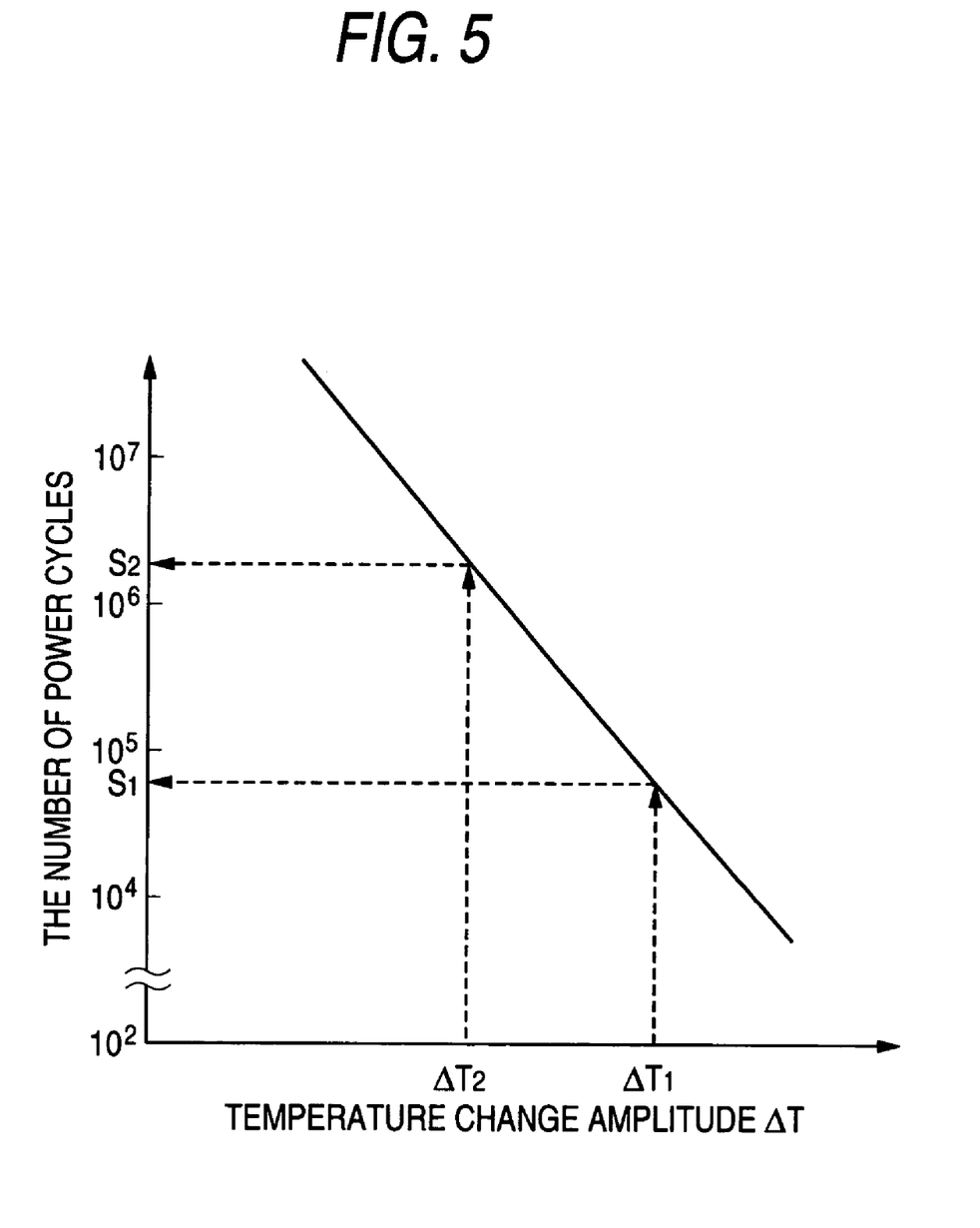
FIG. 5 is a graph showing one example of characteristics of a power cycle curve stored in a power cycle curve data storage part 14 in the electric motor control apparatus according to the first embodiment.

One example of characteristics of a power cycle curve stored in the power cycle curve data storage part in the electric motor control apparatus according to the first embodiment is shown in FIG. 5. In FIG. 5, the axis of abscissa is temperature change amplitude $\Delta T$ (the temperature change amplitude signal 109 outputted from the thermal stress computation part 13) and the axis of ordinate is the number S of power cycles (the power cycle number signal 110 outputted to the thermal stress computation part 13) used as the power cycle life of the semiconductor device. There is a correlation between the temperature change amplitude and the power cycle life of the semiconductor device, and the power cycle life becomes short (S1<S2) as the temperature change amplitude is large ($\Delta T1>\Delta T2$).

Also, the thermal stress computation part 13 receives the number S1 of power cycles obtained corresponding to the temperature change amplitude $\Delta T1$ as the power cycle number signal 110, and computes a thermal stress coefficient x1 by Formula (2), and outputs its result to a life estimation part 15a as a thermal stress signal 111.

$$x1=1/S1 \quad (2)$$

Subsequently, in like manner, the numbers S2, S3, S4, ... of power cycles corresponding to the temperature change amplitudes $\Delta T2$, $\Delta T3$, $\Delta T4$, ... are received from the power cycle curve data storage part 14 and thermal stress coefficients x2(=1/S2), x3(=1/S3), x4(=1/S4), ... are computed and outputs are produced to the life estimation part 15a as thermal stress signals 111.

When the thermal stress coefficient is inputted as the thermal stress signal 111, the life estimation part 15a obtains a summative thermal stress coefficient X by addition as shown in Formula (3) and outputs the summative thermal stress coefficient to a display part 16 as a life estimation result signal 112.

$$X=X0(\text{previous value})+x1+x2+x3+x4+ \quad (3)$$

Also, the case of the summative thermal stress coefficient X=1 corresponds to a life, so that when the summative thermal stress coefficient X approximates to 1, an alarm is outputted to the display part 16 as the life estimation result signal 112 and a worker is informed that the life is near.

Also, the life estimation part 15a receives set time $\Delta t$ set by an operating time setting part 17 as a set time signal 113, and receives and sums the thermal stress coefficients x1, x2, x3, ..., xn by the thermal stress signals 111 outputted from the thermal stress computation part 13 for only the set time $\Delta t$, and obtains a thermal stress coefficient Xt per set time $\Delta t$ by Formula (4).

$$Xt=x1+x2+\ldots+xn \quad (4)$$

Also, life time tL is calculated by Formula (5), and an expected life signal 114 which is an expected life te set by an expected life setting part 18 is compared with the life time tL calculated by Formula (5) and in the case of tL<te, an alarm is outputted to the display part 16 as a life determination signal 115 and a worker is prompted to take life-prolonging measures.

$$tL=\Delta t\times(1/Xt) \quad (5)$$

As described above, according to the first embodiment, it is constructed so as to calculate a power cycle life by referring to power cycle curve data specific to a semiconductor device every temperature change amplitude computed by the temperature change estimation part, so that with respect to any temperature change amplitude, thermal stress weighted based on its amplitude can be computed and summed, and life estimation with high accuracy and determination of an expected life can be implemented.

Second Embodiment

Figure 6:
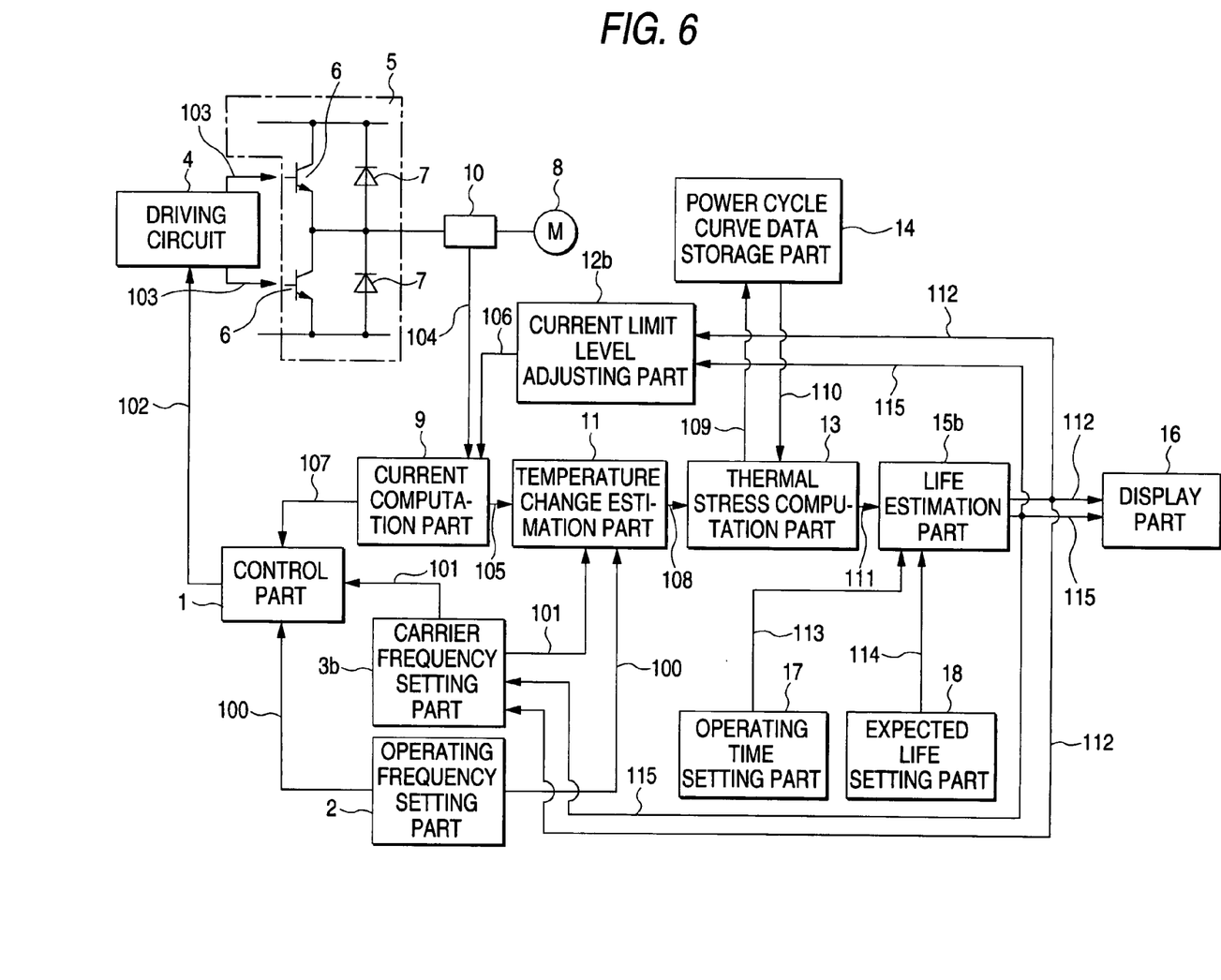
FIG. 6 is a diagram showing a configuration of an electric motor control apparatus according to a second embodiment of this invention.

FIG. 6 is a diagram showing a configuration of an electric motor control apparatus according to a second embodiment of this invention. In the diagram, numerals 1, 2, 4 to 11, 13, 14, 16 to 18, 100 to 115 are similar to those of FIG. 1 and the description is omitted.

A life estimation part 15b outputs a life estimation result signal 112 and a life determination signal 115 to a carrier frequency setting part 3b and a current limit level adjusting part 12b.

When a summative thermal stress coefficient X included in the inputted life estimation result signal 112 approximates to 1, or when the life determination signal 115 outputted in the case that life time tL falls below an expected life te is inputted, the current limit level adjusting part 12b makes an automatic adjustment so as to decrease a current limit value signal 106 outputted to a current computation part 9.

When a life of a semiconductor device such as power transistors 6 and diodes 7 becomes short, an automatic adjustment is made so as to decrease the current limit value signal 106 and an output current I is limited rather low and thereby the steady-state loss Ps and the switching loss Psw shown in FIGS. 2 and 3 can be decreased, so that a heating value Q of the semiconductor device can be suppressed. As a result of this, even when a worker does not inspect the electric motor control apparatus and does not take life-prolonging measures, an automatic adjustment can be made so as to satisfy an expected life of the semiconductor device set by an expected life setting part 18.

Also, when a summative thermal stress coefficient X included in the inputted life estimation result signal 112 approximates to 1, or when the life determination signal 115 outputted in the case that life time tL falls below an expected life te is inputted, the carrier frequency setting part 3b makes an automatic adjustment so as to lower an upper limit value of a carrier frequency and outputs a carrier frequency signal 101 to a control part 1.

When a life of the semiconductor device such as power transistors 6 and diodes 7 becomes short, an automatic adjustment is made so as to lower the upper limit value of the carrier frequency, so that a term of the switching loss Psw of Formula (1) by which a heating value Q of the semiconductor device is obtained can be decreased and the heating value Q of the semiconductor device can be suppressed. As a result of this, even when a worker does not inspect the electric motor control apparatus and does not take life-prolonging measures, an automatic adjustment can be made so as to satisfy the expected life of the semiconductor device set by the expected life setting part 18.

Also, when it is decided that a life of the semiconductor device becomes short and the carrier frequency is lowered by an automatic adjustment, noise of an electric motor increases, so that a worker can be prompted by being informed that the life of the semiconductor device is near, and the worker can take measures to replace the electric motor control apparatus before an abnormal stop of a system is made due to a fault caused by the life of the semiconductor device.

In the second embodiment, since it is constructed so that the heating value Q of the semiconductor device is suppressed by making an automatic adjustment so as to decrease the current limit value signal 106 and also making an automatic adjustment so as to lower the upper limit value of the carrier frequency when a life of the semiconductor device becomes short, a system can be prevented from stopping before a worker inspects an alarm displayed by the display part 16 even when the semiconductor device results in the life rapidly due to thermal stress caused by sudden variations in an output current occurring in the case of a compressor etc. with large variations in a load. Also, even when the worker does not inspect the electric motor control apparatus and does not take life-prolonging measures, an automatic adjustment can be made so as to satisfy an expected life of the semiconductor device set by the expected life setting part 18.

INDUSTRIAL APPLICABILITY

As described above, an electric motor control apparatus of the present invention can implement life estimation with high accuracy and determination of an expected life, so that the electric motor control apparatus is suitable for application in which start and stop control is performed frequently. Also, even when a worker does not inspect a display part and does not take life-prolonging measures, an automatic adjustment can be made so as to satisfy an expected life of a semiconductor device set by an expected life setting part, so that the electric motor control apparatus is suitable for application in which a decrease in speed of operation is allowed with respect to command speed.

The invention claimed is:

1. An electric motor control apparatus for converting DC electric power into AC electric power of a variable frequency and a variable voltage and performing variable control of an electric motor acting as a load, comprising:
    a switching circuit having a semiconductor device including a power transistor,
    a control part for generating a driving pulse based on an operating frequency signal set by an operating frequency setting part and a carrier frequency signal set by a carrier frequency setting part, and
    a driving circuit for amplifying the driving pulse outputted from the control part and performing on-off control of the power transistor of the switching circuit, the electric motor control apparatus comprising:
    a current computation part for computing an output current from a current flowing through the semiconductor device and also outputting a current breaking signal to the control part when an output current signal computed exceeds a current limit value signal outputted from a current limit level adjusting part,
    a temperature change estimation part for estimating changes in temperature of the semiconductor device to compute temperature change amplitude based on the output current signal, the operating frequency signal and the carrier frequency signal,
    a power cycle curve data storage part for storing power cycle curve data showing a relation between the temperature change amplitude and a power cycle life of the semiconductor device,
    a thermal stress computation part for converting the temperature change amplitude computed by the temperature change estimation part into the number of power cycles used as the power cycle life of the semiconductor device by the power cycle curve data and computing a thermal stress signal, and
    a life estimation part for doing life estimation of the semiconductor device based on the thermal stress signal and producing an output to a display part as a life estimation result signal and further calculating life time per set time and comparing the life time with an expected life and outputting an alarm to the display part as a life determination signal when the life time is shorter than the expected life.

2. An electric motor control apparatus as claimed in claim 1, wherein the life estimation part outputs the life estimation result signal and the life determination signal to the current limit level adjusting part and also the current limit level adjusting part makes an automatic adjustment so as to decrease a current limit value signal outputted to the current computation part when alarm information is included in the life estimation result signal or the life determination signal is inputted.

3. An electric motor control apparatus as claimed in claim 1, wherein the life estimation part outputs the life estimation result signal and the life determination signal to the carrier frequency setting part and also the carrier frequency setting part makes an automatic adjustment so as to lower an upper limit value of the carrier frequency and outputs a carrier frequency signal to the control part when alarm information is included in the life estimation result signal or the life determination signal is inputted.

* * * * *